United States Patent
Kim et al.

(10) Patent No.: US 8,174,806 B2
(45) Date of Patent: May 8, 2012

(54) ELECTROSTATIC DISCHARGE PROTECTION ELEMENT AND ELECTROSTATIC DISCHARGE PROTECTION CIRCUIT INCLUDING THE SAME

(75) Inventors: Suk-Jin Kim, Hwaseong-si (KR);
Han-Gu Kim, Seongnam-si (KR);
Jae-Hyok Ko, Hwaseong-si (KR);
Hyo-Cheol Ban, Jeju-si (KR);
Min-Chang Ko, Hwaseong-si (KR);
Kyoung-Ki Jeon, Gumi-si (KR)

(73) Assignee: Samsung Electronics Co., Ltd. (KR)

( * ) Notice: Subject to any disclaimer, the term of this patent is extended or adjusted under 35 U.S.C. 154(b) by 183 days.

(21) Appl. No.: 12/658,700

(22) Filed: Feb. 12, 2010

(65) Prior Publication Data
US 2010/0214705 A1    Aug. 26, 2010

(30) Foreign Application Priority Data

Feb. 26, 2009 (KR) .................. 10-2009-0016348

(51) Int. Cl.
*H02H 9/00* (2006.01)
(52) U.S. Cl. ..................................................... 361/56
(58) Field of Classification Search .................. 361/56
See application file for complete search history.

(56) References Cited

U.S. PATENT DOCUMENTS

| | | | | |
|---|---|---|---|---|
| 5,100,829 A * | 3/1992 | Fay et al. | ............... | 438/54 |
| 5,576,557 A * | 11/1996 | Ker et al. | ............... | 257/173 |
| 5,640,036 A * | 6/1997 | Lee et al. | ............... | 257/355 |
| 5,998,245 A * | 12/1999 | Yu | ............... | 438/140 |
| 7,285,458 B2 * | 10/2007 | Manna et al. | ............... | 438/237 |
| 2004/0026728 A1 * | 2/2004 | Yoshida et al. | ............... | 257/303 |
| 2007/0235808 A1 * | 10/2007 | Chang et al. | ............... | 257/355 |
| 2008/0001646 A1 * | 1/2008 | Lui et al. | ............... | 327/427 |
| 2009/0008758 A1 * | 1/2009 | Lu et al. | ............... | 257/676 |
| 2010/0214705 A1 * | 8/2010 | Kim et al. | ............... | 361/56 |
| 2010/0232077 A1 * | 9/2010 | Worley | ............... | 361/56 |
| 2010/0246077 A1 * | 9/2010 | Jeong et al. | ............... | 361/56 |

FOREIGN PATENT DOCUMENTS

| | | | |
|---|---|---|---|
| JP | 5326823 A | 12/1993 | |
| JP | 7249738 A | 9/1995 | |
| JP | 11220093 A | 8/1999 | |

* cited by examiner

*Primary Examiner* — Ronald W Leja
(74) *Attorney, Agent, or Firm* — Onello & Mello, LLP

(57) ABSTRACT

An electrostatic discharge (ESD) protection element includes a first diode, a second diode, and a poly resistor. The first diode is connected between a first voltage and an input/output (I/O) pad. The second diode is connected between the I/O pad and a second voltage. The poly resistor is formed on the second diode.

18 Claims, 5 Drawing Sheets

ELECTROSTATIC DISCHARGE PROTECTION ELEMENT AND ELECTROSTATIC DISCHARGE PROTECTION CIRCUIT INCLUDING THE SAME

CROSS-REFERENCE TO RELATED APPLICATIONS

This application claims priority under 35 USC §119 to Korean Patent Application No. 10-2009-0016348, filed on Feb. 26, 2009 in the Korean Intellectual Property Office (KIPO), the disclosure of which is incorporated herein in its entirety by reference.

BACKGROUND

1. Technical Field

Example embodiments relate to an electrostatic discharge protection circuit and more particularly to an electrostatic discharge protection element in a semiconductor memory device.

2. Description of the Related Art

An electrostatic discharge (ESD) is a momentary electric current which flows between two objects having different electrical potentials caused by a direct contact or induced by an electrostatic field.

Semiconductor memory devices may include ESD protection circuits between an input/output (I/O) pad and an internal circuit to prevent the ESD from damaging isolation layers and channel regions formed in the internal circuit.

The ESD may destroy an element, an oxide layer, and a metal wiring which are included in the internal circuit. For example, a high electric current and electronic field may cause a Joule heat in contact regions of the internal circuit, and a second breakdown due to the Joule heat may cause damage to the internal circuit elements. As very-large scale integration (VLSI) circuits become smaller, the oxide layer therein also become thinner, and thus the oxide layer may be easily deteriorated by sudden high electric current, such as that caused by ESD. In addition, the metal wiring becomes thinner, and thus the metal wiring may be easily destroyed due to the high operational temperature, such as that caused by ESD.

Operational characteristics of the damaged internal circuit elements may be degraded such that an ESD threshold voltage may become lower and a leakage current may increase, and thus the damaged internal circuit elements will not be able to perform desired operations under such conditions.

As the semiconductor device becomes smaller, the oxide layer becomes thinner, and thus an improved function for ESD protection is highly recommended.

SUMMARY

In accordance with various aspects of the present invention, provided is an electrostatic discharge (ESD) protection element including a poly resistor formed in a diode region for reducing a vertical length.

Also in accordance with various aspects of the present invention, provided is an ESD protection circuit that includes the ESD protection element having the poly resistor for preventing damage to a device under test.

In accordance with one aspect of the present invention, provided is an ESD protection element that includes a first diode, a second diode and a poly resistor. The first diode is connected between a first voltage and an input/output (I/O) pad, and the second diode is connected between the I/O pad and a second voltage. The poly resistor is formed on the second diode.

The ESD protection element may be formed on a p-type substrate.

The second diode may include a first n-well region, and a first n-type impurity region formed in the first n-well region.

The poly resistor may be formed on a surface of the first n-type impurity region. The first n-type impurity region may be connected to the I/O pad.

The second diode may further include a first p-type impurity region.

For example, the first p-type impurity region may be connected to the second voltage.

The first diode may include a second n-well region, a second p-type impurity region formed in the second n-well region, and a second n-type impurity region formed in the second n-well region.

For example, the first diode may be a p-type diode and the second diode is an n-type diode.

In accordance with another aspect of the present invention, provided is an electrostatic discharge (ESD) protection circuit that includes an ESD protection element and an internal circuit. The ESD protection element is connected between first and second voltages, and receives a signal from an input/output (I/O) pad. The ESD protection element includes a first diode, a second diode, and a poly resistor. The first diode is connected between the first voltage and the I/O pad. The second diode is connected between the I/O pad and the second voltage. The poly resistor is formed on the second diode.

The ESD protection element may be formed on a p-type substrate, and the second diode may include a first n-well region, a first n-type impurity region formed in the first n-well region and a first p-type impurity region.

The poly resistor may be formed on a surface of the first n-type impurity region.

The ESD protection circuit may further include a sub-ESD protection element connected to the ESD protection element in parallel. The sub-ESD protection element may receive the signal through the poly resistor and output the signal to the internal circuit.

The sub-ESD protection element may include at least one sub diode.

For example, the first diode may be a p-type diode, and the second diode may be an n-type diode.

In accordance with another aspect of the present invention, provided is an electrostatic discharge (ESD) protection circuit that includes a plurality of ESD protection elements and an internal circuit. The plurality of ESD protection elements is connected between first and second voltages, and each ESD protection element receives a signal from an input/output (I/O) pad. The plurality of ESD protection elements includes a first diode, a second diode, and a poly resistor, respectively. The first diode is connected between the first voltage and the I/O pad. The second diode is connected between the I/O pad and the second voltage. The poly resistor is formed on the second diode.

Each of the ESD protection elements may be formed on a p-type substrate, wherein the second diode can include a first n-well region and a first n-type impurity region formed in the first n-well region. The poly resistor is formed on a surface of the first n-type impurity region.

For each of the ESD protection elements, the first n-type impurity region may be connected to the I/O pad.

For each of the ESD protection elements, the second diode may further include a first p-type impurity region.

For each of the ESD protection elements, the first p-type impurity region may be connected to the second voltage.

For each of the ESD protection elements, the first diode may include a second n-well region, a second p-type impurity region formed in the second n-well region, and a second n-type impurity region formed in the second n-well region.

For example, for each of the ESD protection elements, the first diode may be a p-type diode and the second diode is an n-type diode.

The ESD protection element according to some example embodiments includes the poly resistor formed on the diode, and thus the vertical length of the ESD protection element may be reduced.

Accordingly, The ESD protection circuit including the ESD protection element may be implemented smaller than the conventional ESD protection circuit, and thus the ESD protection circuit according to some example embodiments may have an improved function for protecting the internal circuits.

BRIEF DESCRIPTION OF THE DRAWINGS

Illustrative, non-limiting example embodiments illustrating aspects of the present invention will be more clearly understood from the following detailed description taken in conjunction with the accompanying drawings; wherein.

DESCRIPTION OF EXAMPLE EMBODIMENTS

Figure 1:
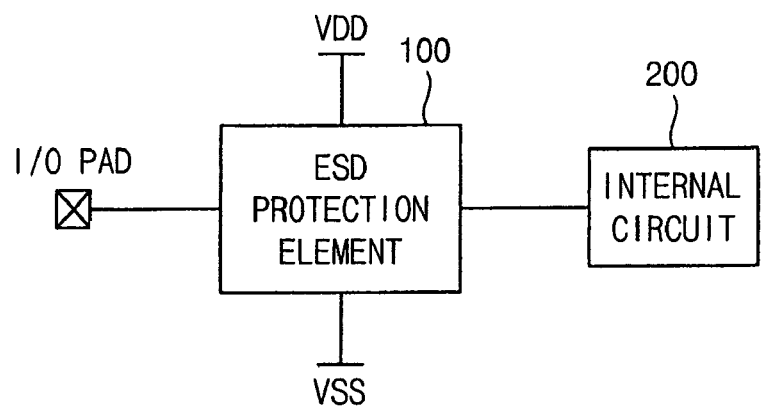
FIG. 1 is a block diagram illustrating an example embodiment of an electrostatic discharge (ESD) protection circuit including an ESD protection element according to some aspects of the present invention.

Embodiments of the inventive concept now will be described more fully with reference to the accompanying drawings, in which embodiments in accordance with aspects of the inventive concept are shown. The present inventive concept may, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or"includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram illustrating an example embodiment of an electrostatic discharge (ESD) protection circuit including an ESD protection element according to aspects of the present invention.

Referring to FIG. 1, the ESD protection circuit 10a may include an ESD protection element 100 and an internal circuit 200.

The ESD protection element 100 is connected between a first voltage VDD and a second voltage VSS, and connects an input/output (I/O) pad and the internal circuit 200.

When a high electric current is momentarily applied to I/O pad, if the electric current is transferred to the internal circuit 200 through the I/O pad, a gate oxide or a p-n junctions included in transistors of the internal circuit 200 may be damaged, and thus overall operations, durability, and reliability of the internal circuit 200 may degrade.

Hereinafter, a high voltage or the high current due to the ESD is referred to as an ESD current.

The ESD protection element 100 discharges the ESD current to the first voltage VDD or the second voltage VSS, and thus protects the internal circuit 200. The ESD protection element 100 may include a diode, a Bipolar Junction Transistor (BJT), a Metal Oxide Semiconductor Field Effect Transistor (MOSFET), or the like. The first voltage VDD may correspond to a power supply voltage and the second voltage VSS may correspond to a ground voltage.

Figure 2:
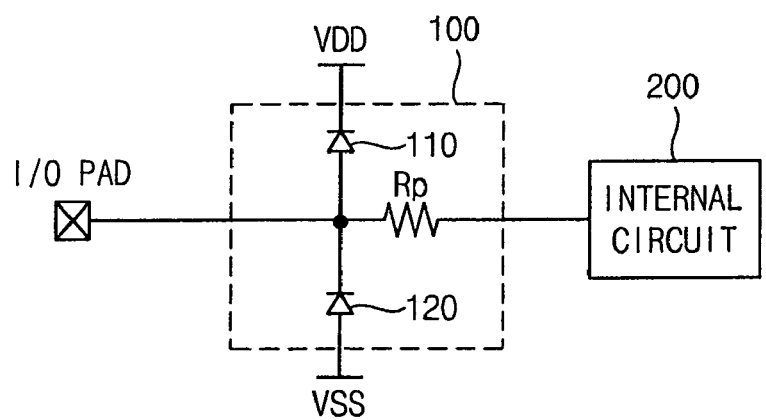
FIG. 2 is a circuit diagram illustrating an example embodiment of an ESD protection circuit according to aspects of the present invention.

FIG. 2 is a circuit diagram illustrating an example embodiment of an ESD protection circuit according to other aspects of the present invention.

Referring to FIG. 2, the ESD protection element 100 may include a first diode 110, a second diode 120, and a poly resistor Rp. The first diode 110 may be a p-type diode and the second diode 120 may be an n-type diode.

The ESD protection element 100 discharges the ESD current into the first voltage VDD through the p-type diode 110 or discharges the ESD current into the second voltage VSS through the n-type diode 120, depending on a level of the ESD current.

The p-type diode 110 is connected between the first voltage VDD and the I/O pad, and the n-type diode 120 is connected between the I/O pad and the second voltage VSS. The p-type diode 110 and the n-type diode 120 are connected in series, with the I/O pad connected between the p-type diode 110 and the n-type diode 120.

The internal circuit 200 is connected to the I/O pad through the poly resistor Rp. When the ESD current is applied to the I/O pad, the poly resistor Rp dissipates powers caused by the ESD current to prevent damage to the internal circuit 200. The poly resistor Rp may include a plate poly forming a cell plate, a resistor poly, or the like.

The ESD protection circuit 10b may further include a clamping circuit (not shown). The clamping circuit can be connected between the I/O pad and the first voltage VDD, the I/O pad and the second voltage VSS, or the first and the second voltages VDD and VSS. In an example embodiment, the clamping circuit may include at least one diode. The clamping circuit limits a voltage fluctuation of the internal circuit 200 within a predetermined range. For example, in a case where the clamping circuit is connected between the I/O pad and the second voltage VSS, and the ESD current having a positive level is applied to the I/O pad, the clamping circuit discharges the ESD current into the second voltage VSS, and thus the ESD current may have a negative level. Therefore, the ESD protection circuit 10b that includes the clamping circuit for reducing the sudden voltage fluctuation may protect the internal circuit 200.

When an ESD current having a positive level is applied to the I/O pad, the p-type diode 110 may be forwardly biased and the n-type diode 120 may be reverse biased; the ESD current is then discharged into the first voltage VDD through the p-type diode 110.

When an ESD current having the negative level is applied to the I/O pad, the p-type diode 110 may be reversely biased and the n-type diode 120 may be forwardly biased; the ESD current is then discharged into the second voltage VSS through the n-type diode 120.

Therefore, the ESD protection element 100 discharges the ESD current to prevent the ESD current flowing through the internal circuit 200, and thus the internal circuit 200 may be protected.

Figure 3A:
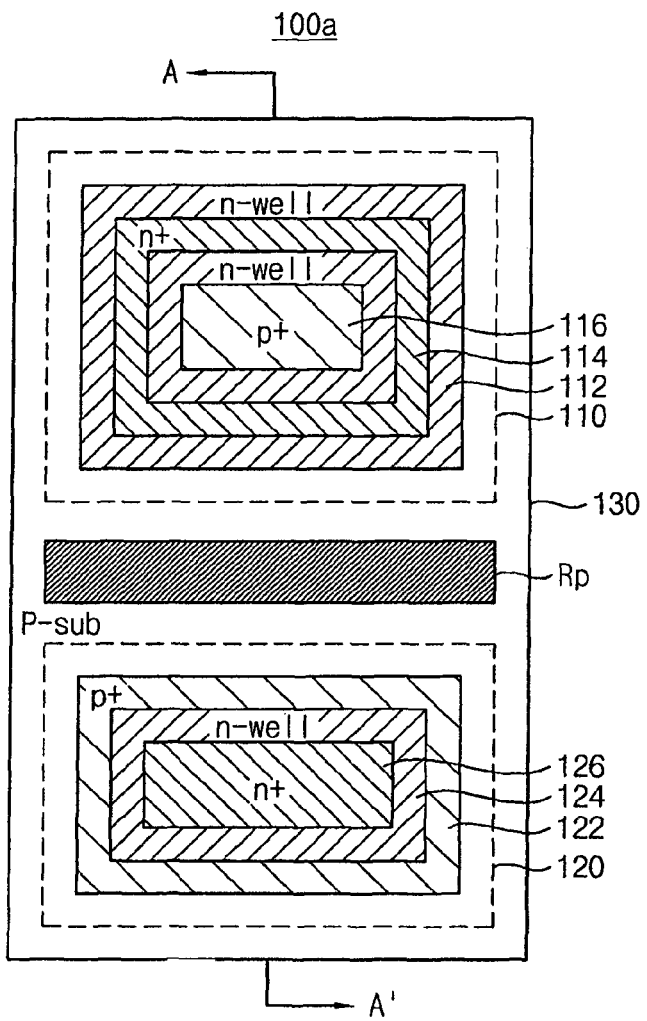
FIG. 3A is a layout diagram illustrating an example embodiment of an ESD protection element according to aspects of the present invention.

FIG. 3A is a layout diagram illustrating an embodiment of ESD protection elements.

Referring to FIG. 3A, the p-type diode 110, the poly resistor Rp, and the n-type diode 120 are formed on a p-type substrate 130.

The p-type diode 110 may include an n-well region 112, an n-type impurity region 114, and a p-type impurity region 116. The n-type diode 120 may include a p-type impurity region 122, an n-well region 124, and an n-type impurity region 126.

The poly resistor Rp may be formed between the p-type diode 110 and the n-type diode 120. Therefore, a vertical length of the ESD protection element 100a may correspond to a value obtained by adding vertical lengths of the p-type diode 110, the poly resistor Rp, and the n-type diode 120.

Figure 3B:
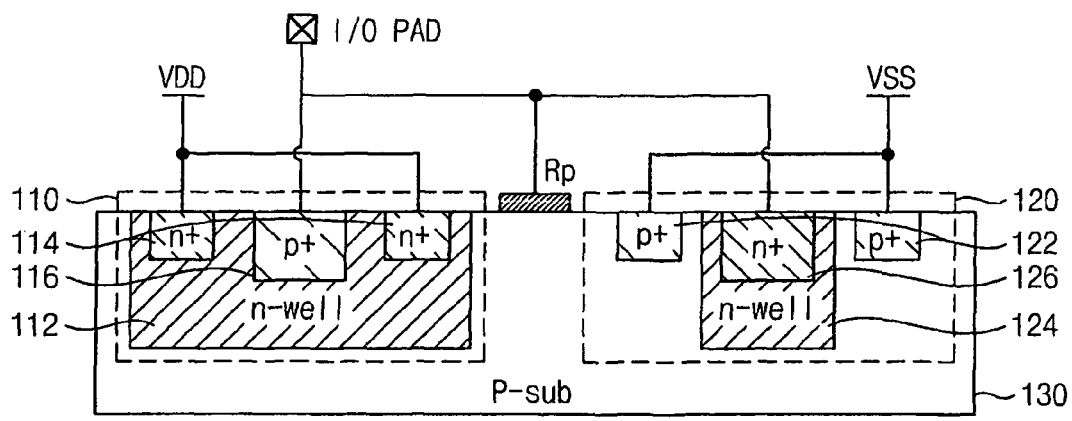
FIG. 3B is a cross-sectional view taken along line A-A' of the ESD protection element of FIG. 3A.

FIG. 3B is a cross-sectional view taken vertically along line A-A' of the ESD protection element of FIG. 3A.

Referring to FIG. 3B, the ESD protection element 100a is formed on the p-type substrate 130. The p-type diode 110 may include the n-well region 112, the n-type impurity region 114, and a p-type impurity region 116. The n-type impurity region 114 is connected to the first voltage VDD, and the p-type impurity region 116 is connected to the I/O pad. The p-type impurity region 116 and the n-well region 112 may form a p-n junction, and operate as a diode. For example, when a forward current is applied to the I/O pad, the forward current flows from the p-type impurity region 116 to the n-well region 112, which is a direction of the p-n junction. However, when a reverse current is applied to the I/O pad, since a reverse bias is formed between the n-well region 112 and the p-type impurity region 116, the reverse current does not flow from the n-well region 112 to the p-type impurity region 116, which would be a reverse direction of the p-n junction.

The p-type impurity region 116 is connected to the I/O pad, and operates as a cathode. When the ESD current having the positive level is applied to the p-type impurity region 116, the ESD current flows along the direction of the p-n junction, and then the ESD current is discharged into the first voltage VDD through the n-type impurity region 114 connected thereto. Since the n-type impurity region 114 is formed in two portions in the p-type diode 110, the ESD current may be discharged along two paths into the first voltage VDD.

The n-type diode 120 may include a p-type impurity region 122, an n-well region 124, and an n-type impurity region 126. The p-type impurity region 122 is connected to the second voltage VSS, and the n-type impurity region 126 is connected to the I/O pad. The n-well region 124 and the p-type substrate 130 form the p-n junction, and operate as the diode. In the n-type diode 120, the current flows from the p-type substrate 130 to the n-well region 124, whereas the current does not flow from the n-well region 124 to the p-type substrate 130 according to inherent characteristics of the diodes. The n-well impurity region 126 is connected to the I/O pad, and operates as an anode. The p-type impurity region 122 is connected to the second voltage VSS, and operates as the cathode. When the ESD current having the negative level is applied to the internal circuit 200, the ESD current may be discharged through the p-n junction formed by the n-well region 124 and the p-type substrate 130.

Therefore, the p-type diode 110 may correspond to a pull-up diode that pulls up the ESD current to the first voltage VDD, and the n-type diode 120 may correspond to a pull-down diode that pulls down the ESD current to the second voltage VSS. Since each diode forms the p-n junction where the current flows in only one direction, the ESD protection element 100a may protect the internal circuit 200 regardless of the levels of the ESD current.

The poly resistor Rp is formed between the p-type diode 110 and the n-type diode 120, and is formed on the p-type substrate 130. The poly resistor Rp further discharges the ESD current that may possibly still remain even though the p-type and n-type diodes 110 and 120 discharge at least a portion of the ESD current, and thus the poly resistor Rp reduces the possibility and magnitude of damage to the internal circuit 200. The poly resistor Rp may include additional discharge means for preventing deterioration or damage of the resistor. Since the power consumption may cause internal heating, and thus the poly resistor Rp may further include cooling devices, radiation devices, heat synching devices, or other heat dissipation mechanisms or devices.

Figure 4A:
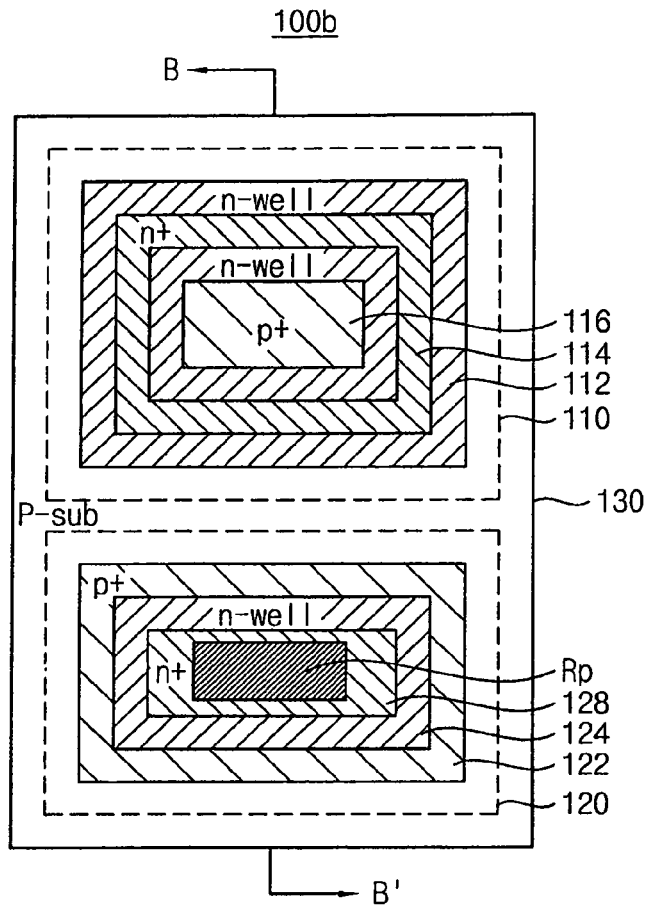
FIG. 4A is a layout diagram illustrating an example embodiment of an ESD protection element according to aspects of the present invention.

FIG. 4A is a layout diagram illustrating an example embodiment of an ESD protection element according to aspects of the present invention.

Referring to FIG. 4A, the ESD protection element 100b may include a p-type diode 110, an n-type diode 120, and a poly resistor Rp. Compared with the ESD protection element 100a of FIG. 3A, the ESD protection element 100b includes the poly resistor Rp formed on an n-type impurity region 128 included in the n-type diode 120. The poly resistor Rp is formed not on the p-type substrate 130, but on an n-type impurity region, and thus a vertical length of the ESD protection element 100b is obtained by adding vertical lengths of the p-type and n-type diodes 110 and 120. For example, the poly resistor Rp may be formed on a surface of the n-type impurity region 128 of the n-type diode 120. Thus, the ESD protection element 100*b* may reduce the vertical length by an amount about equal to the vertical length of the poly resistor Rp.

Figure 4B:
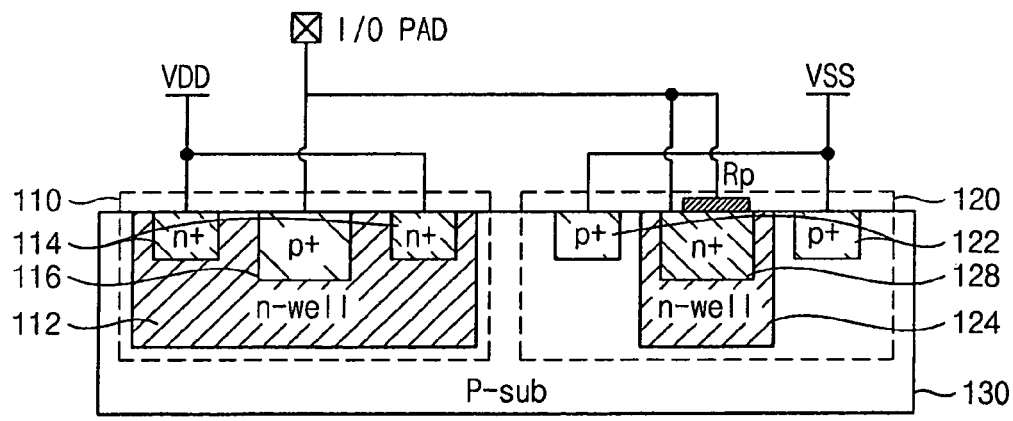
FIG. 4B is a cross-sectional view taken along line B-B' of the ESD protection element of FIG. 4A.

FIG. 4B is a cross-sectional view taken vertically along line B-B' of the ESD protection element of FIG. 4A.

Referring to FIG. 4B, the p-type diode 110 may include an n-well region 112, an n-type impurity region 114, and a p-type impurity region 116. The n-type diode 120 may include the p-type impurity region 122, the n-well region 124, and the n-type impurity region 128. Compared with FIG. 3B, the poly resistor Rp is formed on the n-type impurity region 128.

The n-type impurity region 114 included in the p-type diode 110 is connected to the first voltage VDD and operates as an anode. The p-type impurity region 116 is connected to the I/O pad and operates as a cathode. The p-type impurity region 116 and the n-well region 112 form the p-n junction, the p-n junction transfers the ESD current from the p-type impurity region 116 to the n-well region 112; the ESD current is then discharged into the first voltage VDD.

The n-type diode 120 may include the p-type impurity region 122, the n-well region 124 and the n-type impurity region 128. The p-type impurity region 122 is connected to the second voltage VSS and operates as the cathode. The n-type impurity region 128 is connected to the I/O pad and operates as the anode.

The ESD current flows through the p-n junction in a forward direction. Electric charge of the ESD current that flows through the p-n junction may increase according to a depletion region formed within the p-n junction such that the electric charge of the ESD current may increase in proportion to an area of the p-n junction. In this embodiment, the area of the n-well region 124 and the p-type substrate 130, and a contact area of the n-well region 124 and the p-type substrate 130, are substantially the same as that of the ESD protection element 100*a* illustrated in FIGS. 3A and 3B.

Although a size of the ESD protection element 100*b* of FIG. 4A is smaller then a size of the ESD protection element 100*a* of FIG. 3A, the ESD protection element 100*b* may have substantially the same electron mobility as the ESD protection element 100*a*, and thus the ESD current which abruptly inflows may be discharged at the same efficiency. Therefore, the ESD protection elements according to an example embodiment may be implemented as a small size by realigning a location of the poly resistor Rp.

Figure 5A:
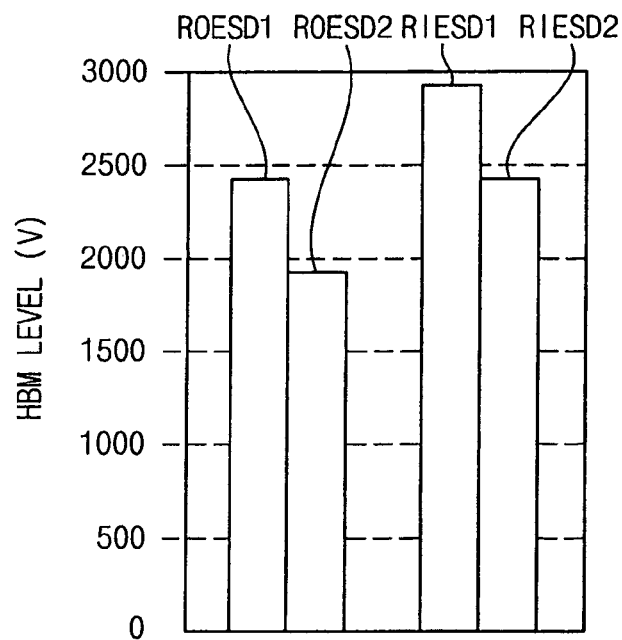
FIGS. 5A, 5B and 5C are diagrams illustrating experimental results of various ESD protection elements according to aspects of the present invention.
Figure 5B:
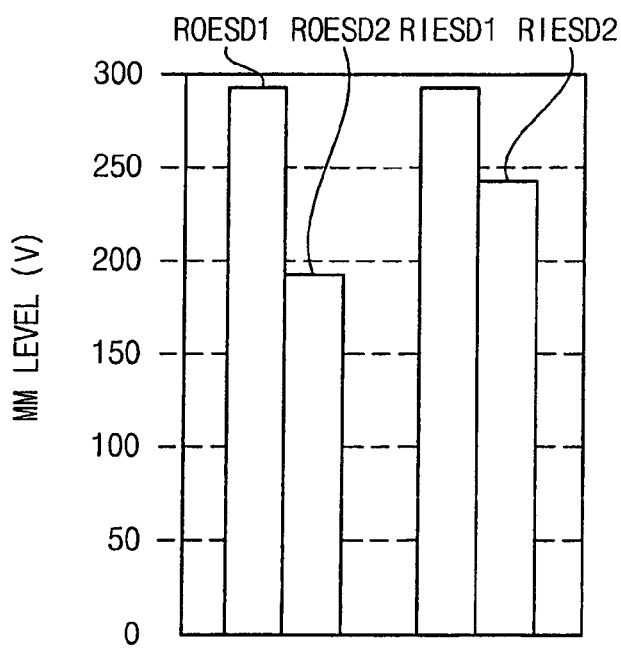
Figure 5C:
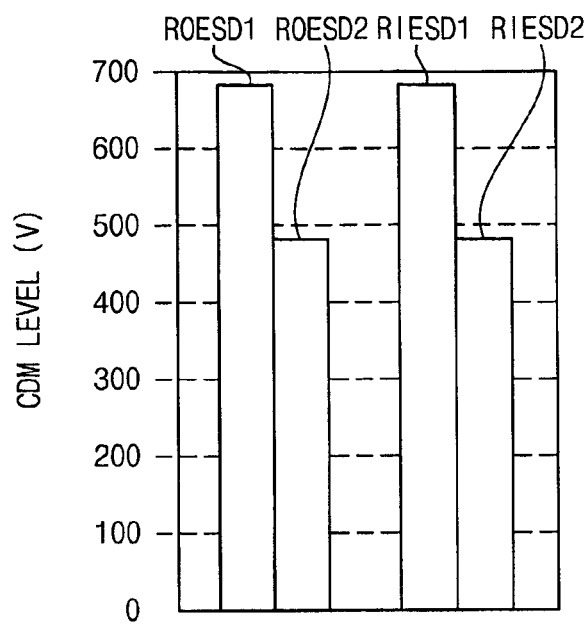

FIGS. 5A, 5B and 5C are diagrams illustrating experimental results of the ESD protection elements according to an example embodiment. Each diagram illustrates experimental results for a different testing model, as a depiction of ESD voltage (V) on the vertical axis for each of a number of ESD design embodiments.

Testing models for examining the ESD protection elements may include a Human Body Model (HBM), a Machine Model (MM), and a Charge Device Model (CDM). During manufacturing process, each of the models may confirm whether a device under test (DUT), such as the internal circuit, may safely and reliably operate or not.

ROESD1 and ROESD2 represent cases where the ESD protection element includes the poly resistor located between the p-type and n-type diodes. In addition, compared with the conventional ESD protection element, a size of the ESD protection element corresponding to ROESD1 is implemented as about 78% of a conventional ESD element and a size of the ESD protection element corresponding to ROESD2 is implemented as about 62% of a conventional ESD element, where a conventional ESD element has a size of about 100%. "Size" as used here means a linear measure, such as an area.

RIESD1 and RIESD2 represent cases where the ESD protection element includes the poly resistor formed on the n-type impurity region included in the n-type diode. In addition, compared with the conventional ESD protection element, a size of the ESD protection element corresponding to RIESD1 is implemented as 78% of a conventional ESD element and a size of the ESD protection element corresponding to RIESD2 is implemented as 62% of a conventional ESD element.

For example, in FIGS. 5A, 5B, and 5C the bars labeled RIESD1 and RIESD2 represent the experimental results of the ESD protection element 100*b* illustrated in FIGS. 4A and 4B, the sizes of which respectively correspond to 78% and 62% compared with the conventional ESD protection element. And in FIGS. 5A, 5B, and 5C the bars labeled ROESD1 and ROESD2 represent the experimental results of the ESD protection element 100*a* illustrated in FIGS. 3A and 3B, the sizes of which respectively correspond to 78% and 62% compared with the conventional ESD protection element.

RIESD1 and RIESD2 are implemented by realigning the location of the poly resistor for reducing size of the ESD protection element. Whereas ROESD1 and ROESD2 are implemented by reducing each size of the n-type diode, the p-type diode, and the poly resistor themselves, so the areas of the p-n junctions are also reduced. Because the areas of the diodes and p-n junctions are reduced, the electron mobility of the ESD protection element is degraded.

FIG. 5A is a diagram illustrating the experimental results of the ESD protection element using the HBM.

The HBM models electrostatic discharge phenomena occurred by a human body. Assuming that a capacitance of the human body as 100 pF, and charged electrons are applied to the ESD protection element through a 1500Ω resistor. A HBM level corresponds to a quantity of electric charge which is momentarily charged and discharged. As the HBM level increases, the ESD protection element may withstand the high voltage, and thus the ESD protection element may perform an improved protection function. For example, when the HBM level corresponds to about 2000V, an ESD current having about 1.4 A abruptly flows within 10 ns.

Referring to FIG. 5A, the HBM level of ROESD1 corresponds to 2450V, ROESD2 corresponds to 1950V, RIESD1 corresponds to 2950V, and RIESD2 corresponds to 2450V. Even though the sizes of ESD protection elements corresponding to ROESD1 and RIESD1 may be substantially the same, the HBM level of RIESD1 is greater than the HBM level of ROESD1, by as much as about 500V. Similarly, although the sizes of ESD protection elements corresponding to ROESD2 and RIESD2 may be substantially the same, the HBM level of RIESD2 is greater than the HBM level of ROESD2, by as much as about 500V. When the ESD protection elements are implemented as the same size, the areas of the p-n junctions of the ESD protection elements corresponding to ROESD1 and ROESD2 are smaller than the areas of the p-n junctions of the ESD protection elements corresponding to RIESD1 and RIESD2.

Therefore, when the ESD protection elements including the poly resistor have substantially the same size, the ESD protection element including the poly resistor on the n-type diode may discharge the ESD current faster than the ESD protection element including the poly resistor between the p-type and the n-type diodes.

FIG. 5B is a diagram illustrating the experimental results of the ESD protection element using the MM.

The MM models electrostatic discharge phenomena occurred by mechanical factors. In the MM, a capacitance of the mechanical devices may correspond to 200 pF and a resistance may be negligible. A MM level may correspond to a quantity of electronic charges charged in the modeling capacitor and discharged abruptly. For example, in a case of a device having an MM level of 200V, an ESD current having about 3.2 A flows within 15 ns.

Referring to FIG. 5B, MM level of ROESD1 corresponds to 300V, ROESD2 corresponds to 200V, RIESD1 corresponds to 300V, and RIESD2 corresponds to 245V.

When the sizes of ESD protection elements correspond to about 78% of the conventional ESD protection element, which are represented by ROESD1 and RIESD1, the MM levels are approximately the same. Whereas, when the sizes of ESD protection elements correspond to about 62% of the conventional ESD protection element, which are represented by to ROESD2 and RIESD2, the MM level of the ESD protection element including the poly resistor formed on the n-type diode is greater than the MM level of the ESD protection element including the poly resistor formed between the p-type and n-type diodes. Thus, as the size of the ESD protection element becomes smaller, the ESD protection element may have an improved protection function by realigning the location of the poly resistor Rp.

FIG. 5C is a diagram illustrating experimental results of the ESD protection element using the CDM.

The CDM may have different fundamentals from the HDM and MM such that the CDM does not have a fixed capacitance and may compose an equivalent circuit according to operational circumstances. The CDM models a capacitor that is charged and discharged when it touches a grounded metal surface. The CDM may be considered important as automated system increases. A CDM level corresponds to a quantity of electronic charge that is charged and then discharged.

Referring to FIG. 5C, CDM levels of ROESD1 and RIESD1 correspond to 700V, and CDM levels of ROESD2 and RIESD2 correspond to 500V.

The CDM levels may not be changed by realigning the locations of the poly resistor. However, with reference to HBM and MM testing results, the ESD protection element may have an improved robustness by realigning a layout. Even though the ESD protection elements have the same CDM level regardless of the location of the poly resistor, the area of the p-type diode, the n-type diode and the poly resistor corresponding to RIESD1 and RIESD2 may be greater than the area of the p-type diode, the n-type diode and the poly resistor corresponding to ROESD1 and ROESD2, and thus the ESD protection elements may effectively perform the protection function.

The ESD protection element is fabricated by forming the poly resistor on the n-type impurity region included in the n-type diode, sustains the area of the p-n junction, and reduces the vertical length of the ESD protection element while maintaining the protection functions. The ESD protection element according to an example embodiment may be applicable to a mobile device, for example, cell phones, personal digital assistants, portable music players, and the like, as well as other types of device.

Figure 6:
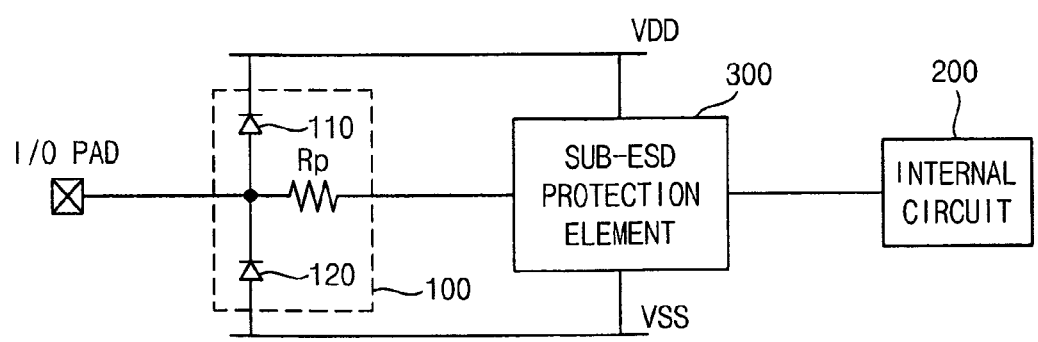
FIG. 6 is a circuit diagram illustrating an example embodiment of an ESD protection circuit according to other aspects of the present invention.

FIG. 6 is a circuit diagram illustrating an embodiment of an ESD protection circuit according to aspects of the present invention.

Referring to FIG. 6, an ESD protection circuit 10c may include an ESD protection element 100, an internal circuit 200, and a sub ESD protection element 300.

The ESD protection element 100 may include a p-type diode 110, an n-type diode and a poly resistor Rp. Structures of the ESD protection element 100 of FIG. 6 may be substantially the same as the ESD protection element 100 of FIGS. 1 and 2. The ESD protection element 100 is connected between the first voltage VDD and the second voltage VSS.

The sub ESD protection element 300 is connected between the first voltage VDD and the second voltage VSS, and is connected to the ESD protection element 100 in parallel. The sub ESD protection element 300 may include resistance elements (not shown). The sub ESD protection element 300 may also include at least a sub diode. For example, the sub ESD protection element 300 may be smaller than the ESD protection element 100. The ESD current flows through the ESD protection element 100 in advance, and then the sub ESD protection element 300 discharges the ESD current that still remains. In an example embodiment, the ESD protection element 100 receives a signal having the ESD current and provides a first protected signal that discharges the ESD current. The sub ESD protection element 300 receives the first protected signal and provides a second protected signal that discharges the remaining ESD current.

The poly resistor Rp included in the ESD protection element 100 consumes the ESD current applied to the sub ESD protection element 300 to prevent damage to the sub ESD protection element.

The ESD protection element 10c may be implemented with a plurality of ESD protection elements connected in parallel to improve the protection functions.

The ESD protection element according to some example embodiments may be formed on the p-type substrate 130 with various elements, such as the sub ESD protection element 300.

The ESD protection element according to some example embodiment may be manufactured by the conventional manufacturing systems with small size, and thus the ESD protection element may be miniaturized in a design phase.

The ESD protection circuit may be mounted on memory chips and may be connected to arbitrary input/output pins.

The ESD protection element and the ESD protection circuit have the poly resistor formed on the diode to reduce the vertical length. Even if the poly resistor is formed on the diode, the area of the p-n junction of the diode may be substantially the same as the conventional ESD protection element, the ESD protection element and the ESD protection circuit according to some example embodiments may have short vertical length while having the same electron mobility. Consequently, the ESD protection element and the ESD protection circuit have improved protection function.

While the example embodiments of the inventive concept have been described in herein, it should be understood that various changes, substitutions, and alternations may be made without departing from the scope of the inventive concept. The present invention, therefore, is not intended to be limited by the various embodiments disclosed herein, but is rather defined by the claims appended hereto.

What is claimed is:

1. An electrostatic discharge (ESD) protection element, comprising:
   a first diode connected between a first voltage and an input/output (I/O) pad;
   a second diode connected between the I/O pad and a second voltage, wherein the second diode comprises:
   a first n-well region;
   a first n-type impurity region formed in the first n-well region; and
   a first p-type impurity region surrounding and apart from the n-well region; and a poly resistor formed on a surface of the first n-type impurity region of the second diode.

2. The ESD protection element of claim 1, wherein the first n-type impurity region is connected to the I/O pad.

3. The ESD protection element of claim 1, wherein the first p-type impurity region is connected to the second voltage.

4. The ESD protection element of claim 1, wherein the first diode comprises:
a second n-well region;
a second p-type impurity region formed in the second n-well region; and
a second n-type impurity region formed in the second n-well region and surrounding the second p-type impurity region.

5. The ESD protection element of claim 1, wherein the first diode is a p-type diode and the second diode is an n-type diode.

6. An electrostatic discharge (ESD) protection circuit, comprising:
an ESD protection element connected between a first voltage and a second voltage, the ESD protection element receiving a signal from an input/output (I/O) pad; and
an internal circuit connected to the ESD protection element,
and wherein the ESD protection element comprises:
a first diode connected between the first voltage and the I/O pad;
a second diode connected between the I/O pad and the second voltage, wherein the second diode comprises:
a first n-well region.
a first n-type impurity region formed in the first n-well region; and
a first p-type impurity region surrounding and apart from the n-well region; and
a poly resistor formed on the second diode.

7. The ESD protection circuit of claim 6, wherein the ESD protection element is formed on a p-type substrate.

8. The ESD protection circuit of claim 6, further comprising:
a sub ESD protection element connected to the ESD protection element in parallel, configured to receive the signal through the poly resistor, and configured to output the signal to the internal circuit.

9. The ESD protection circuit of claim 8, wherein the sub ESD protection element is connected between the first voltage and the second voltage.

10. The ESD protection circuit of claim 8, wherein the sub ESD protection element includes at least one sub diode.

11. The ESD protection circuit of claim 6, wherein the first diode is a p-type diode and the second diode is an n-type diode.

12. An electrostatic discharge (ESD) protection circuit, comprising:
a plurality of ESD protection elements connected between a first voltage and a second voltage in parallel, the protection elements receiving a signal from an input/output (I/O) pad; and
an internal circuit connected to the ESD protection elements,
wherein each of the ESD protection elements comprises:
a first diode connected between the first voltage and the I/O pad;
a second diode connected between the I/O pad and the second voltage, wherein the second diode comprises:
a first n-well region;
a first n-type impurity region formed in the first n-well region; and
a first p-type impurity region surrounding and apart from the n-well region; and
a poly resistor formed on the second diode.

13. The ESD protection circuit of claim 12, wherein each of the ESD protection elements is formed on a p-type substrate.

14. The ESD protection circuit of claim 13, wherein for each of the ESD protection elements, the first n-type impurity region is connected to the I/O pad.

15. The ESD protection circuit of claim 13, wherein for each of the ESD protection elements, the second diode further comprises a first p-type impurity region.

16. The ESD protection circuit of claim 15, wherein for each of the ESD protection elements, the first p-type impurity region is connected to the second voltage.

17. The ESD protection circuit of claim 13, wherein for each of the ESD protection elements, the first diode comprises:
a second n-well region;
a second p-type impurity region formed in the second n-well region; and
a second n-type impurity region formed in the second n-well region and surrounding the second p-type impurity region.

18. The ESD protection circuit of claim 12, wherein for each of the ESD protection elements, the first diode is a p-type diode and the second diode is an n-type diode.

* * * * *